(12) United States Patent
Kim

(10) Patent No.: US 6,735,128 B2
(45) Date of Patent: May 11, 2004

(54) DATA OUTPUT DRIVER OF SEMICONDUCTOR MEMORY DEVICE

(75) Inventor: Jun Bae Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/375,605

(22) Filed: Feb. 27, 2003

(65) Prior Publication Data

US 2003/0174544 A1 Sep. 18, 2003

(30) Foreign Application Priority Data

Mar. 13, 2002 (KR) ........................................ 2002-13624

(51) Int. Cl.[7] ................................................ G11C 7/00
(52) U.S. Cl. ............................ 365/189.05; 365/189.07; 365/221
(58) Field of Search ..................... 365/189.05, 189.07, 365/189.12, 194, 221, 239, 230.06, 233

(56) References Cited

U.S. PATENT DOCUMENTS

| | | | | |
|---|---|---|---|---|
| 5,594,373 A | * | 1/1997 | McClure | ..................... 327/108 |
| 5,596,297 A | * | 1/1997 | McClure et al. | ............. 327/538 |
| 5,767,715 A | | 6/1998 | Marquis et al. | ............. 327/159 |
| 5,805,603 A | | 9/1998 | Araki et al. | ................. 714/700 |
| 5,917,760 A | | 6/1999 | Millar | ......................... 365/194 |
| 5,991,232 A | | 11/1999 | Matsumura et al. | ......... 365/233 |
| 6,072,743 A | | 6/2000 | Amano et al. | .......... 365/230.03 |
| 6,151,274 A | | 11/2000 | Takemae et al. | ............. 365/233 |

* cited by examiner

Primary Examiner—Gene Auduong
(74) Attorney, Agent, or Firm—Ladas & Parry

(57) ABSTRACT

Disclosed is a data output driver which improves the timing margin of a memory operation by reducing skew related to data output in a semiconductor memory device. A register receives and stores a plurality of first parallel data in synchronization with clock signal and outputs a plurality of second parallel data. A controller compares a plurality of parallel data currently inputted to register with a plurality of parallel data previously inputted to register in response to delayed clock signal, and calculates the number of data transitions based on the comparison result, and generates a control signal according to calculated number of data transitions. A clock signal delay part delays clock signal according to a logic level of control signal in order to generate a pair of corrected clock signals. A data selecting part selectively outputs odd or even numbered data among the plurality of second parallel data. An output driving part buffers and outputs output data of the data selecting part.

11 Claims, 3 Drawing Sheets

DATA OUTPUT DRIVER OF SEMICONDUCTOR MEMORY DEVICE

BACKGROUND OF THE INVENTION

1. Field of the invention

The present invention relates to a data output driver, and more particularly to a data output driver which reduces a skew in an interface circuit of a semiconductor memory device.

2. Description of the Prior Art

As generally known in the art, data sequentially written to a register in a semiconductor memory device are sequentially read and outputted from the register in a first-in-first-out (FIFO) manner. At this time, supposing an increased amount of a current flowing through a ground in a data output driver is I1 when one of all input signals is inverted from a low level to a high level, the increased amount thereof becomes N×I1 when all the input signals are inverted from a low level to a high level (N indicates a width of a bus). Since such a great change in current changes the ground voltage, thus reducing the voltage between a gate and a source of a MOS transistor forming the data output driver, driving performance of the data output driver deteriorates. That is, the degree of signal delay varies according to the pattern of data.

When one input signal among all the input signals is inverted from a low logic level to a high logic level, a minimal delay TDmin occurs. When all the input signals are inverted from a low logic level to a high logic level, a maximal delay TDmax occurs. Skew is defined by the following equation 1.

Equation 1

$$SKEW = |TDmax - TDmin|$$

As shown in equation 1, when the difference between the maximal delay TDmax and the minimal delay TDmin is great, the skew becomes greater to reduce the timing margin in a semiconductor memory device. The following table 1 indicates results which models a channel of a Rambus DRAM and measures when the internal data of a chip reaches a memory controller in a READ mode.

TABLE 1

|          | tdly0 | tdly1 | tdly2 | tdly3 | tdly4 | tdly5 | tdly6 | tdly7 |
|----------|-------|-------|-------|-------|-------|-------|-------|-------|
|          |       |       |       |       |       |       |       | (unit: nsec) |
| 10000000 | 3.268 | 0     | 0     | 0     | 0     | 0     | 0     |       |
| 11000000 | 3.300 | 3.299 | 0     | 0     | 0     | 0     | 0     | 0     |
| 11100000 | 3.344 | 3.344 | 3.342 | 0     | 0     | 0     | 0     | 0     |
| 11110000 | 3.367 | 3.368 | 3.367 | 3.362 | 0     | 0     | 0     | 0     |
| 11111000 | 3.394 | 3.396 | 3.397 | 3.392 | 3.375 | 0     | 0     | 0     |
| 11111100 | 3.414 | 3.417 | 3.418 | 3.414 | 3.405 | 3.404 | 0     | 0     |
| 11111110 | 3.435 | 3.439 | 3.441 | 3.438 | 3.432 | 3.434 | 3.434 | 0     |
| 11111111 | 3.456 | 3.460 | 3.463 | 3.461 | 3.460 | 3.464 | 3.467 | 3.465 |

In the table 1, tdly 2 indicates the time required that a signal inputted from a third pin DQ2 is outputted and reaches the memory controller. A tdly 2 of "0" indicates that a signal transmission does not occur because no transitions of a signal occur in an observing moment. As shown in table 1, when the number of transitions to a logic high level is one, the delay time in an input signal is 3.268 nsec. In contrast, when the number of transitions to a logic high level is eight, the delay time in an input signal is 3.456 nsec. The difference between the delay times according to patterns, that is the skew, is 188 psec.

SUMMARY OF THE INVENTION

Accordingly, the present invention has been made to solve the above-mentioned problems occurring in the prior art, and an object of the present invention is to provide a data output driver which improves the timing margin of a memory operation by reducing a skew related to a data output in a semiconductor memory device.

In order to accomplish the object, there is provided a data output driver of a semiconductor memory device comprising: a register for receiving and storing a plurality of first parallel data in synchronization with a clock signal and for outputting a plurality of second parallel data; a controller for comparing a plurality of parallel data being inputted to the register with a plurality of parallel data having previously been inputted to the register in response to a delayed clock signal obtained by delaying the clock signal for a predetermined time and calculating the number of data transitions based on the comparison result, and for generating a control signal according to the calculated number of data transitions; a clock signal delay part for delaying the clock signal according to a logic level of the control signal from the controller in order to generate a pair of corrected clock signals; a data selecting part for selectively outputting odd- or even-numbered data among the plurality of second parallel data; and an output driving part for buffering and outputting output data of the data selecting part.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
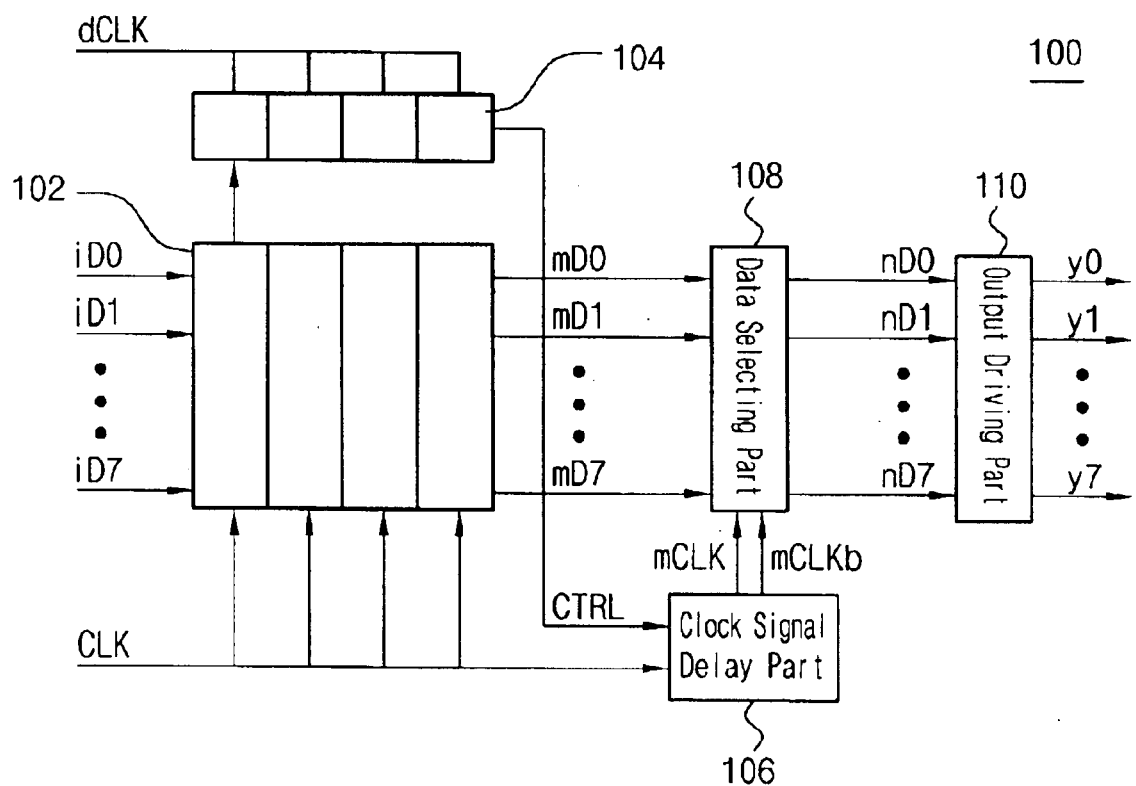
FIG. 1 is a block diagram showing a configuration of a data output driver according to an embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
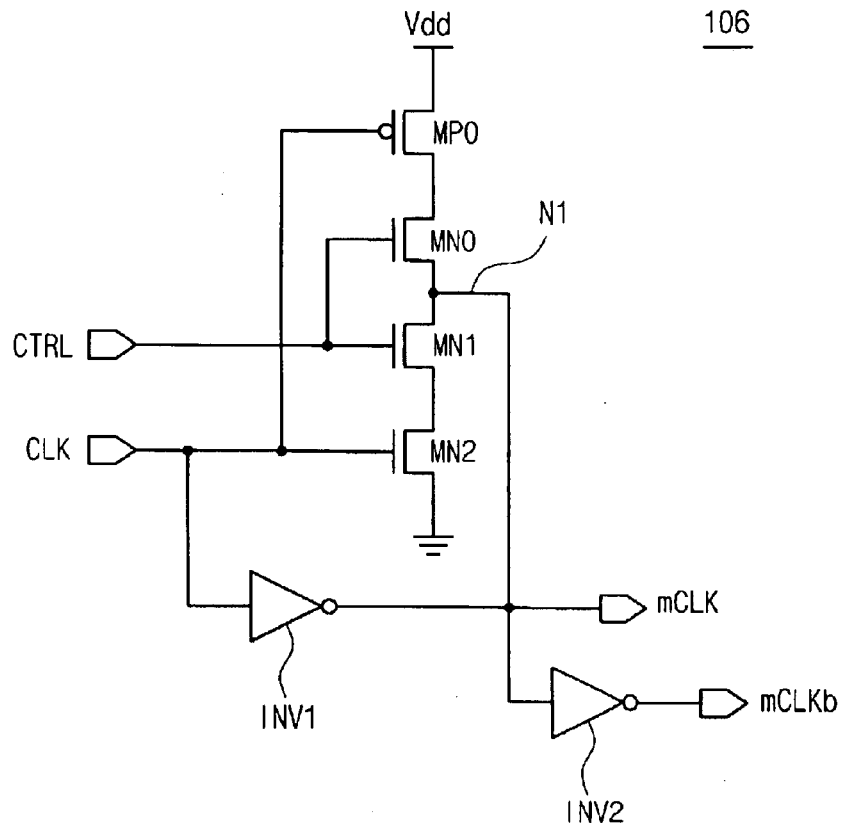
FIG. 2 is a circuitry diagram showing one example of a clock signal delay part shown in FIG. 1.
Figure 3:
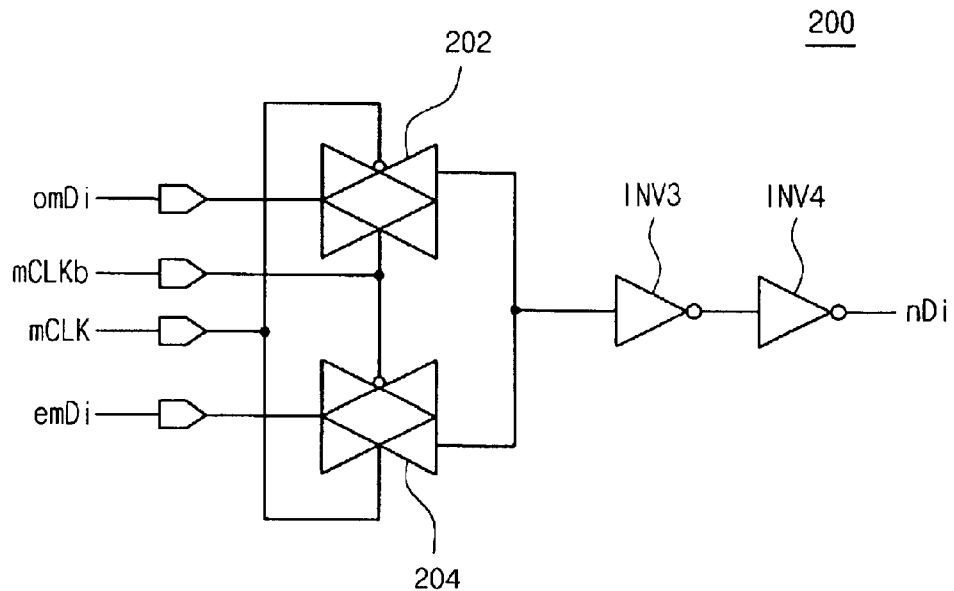
FIG. 3 is a circuitry diagram showing a 2-input multiplexer which forms a data selecting part shown in FIG. 1.

FIG. 1 is a block diagram showing a configuration of a data output driver 100 according to an embodiment of the present invention. FIG. 2 is a circuitry diagram showing one example of a clock signal delay part shown in FIG. 1. FIG. 3 is a circuitry diagram showing a 2-input multiplexer which forms a data selecting part shown in FIG. 1.

The data output driver 100 includes a register 102, a controller 104, a clock signal delay part 106, a data selecting part 108, and an output driving part 110.

The register 102 receives and stores a plurality of first parallel data iD0, iD1, . . . , iD7 read by internal logic (not shown) of a semiconductor memory device in synchronization with a clock signal, and outputs a plurality of second parallel data mD0, mD1, ..., mD7 to the data selecting part 108. The register 102 is formed by a plurality of pipelines and processes the plurality of first parallel data iD0, iD1, ..., iD7 in an FIFO manner in order to increase the total operation speed of the semiconductor memory device.

The controller 104 compares a plurality of parallel data currently inputted to the register 102 with a plurality of parallel data previously inputted thereto in response to a delayed clock obtained by delaying the clock signal for a predetermined time and then calculates the number of data transitions based on the comparison result. The controller 104 generates a control signal CTRL according to the calculated number of data transitions and provides the control signal CTRL to the clock signal delay part 106. In a case in which the number of the plurality of first parallel data is N (where N is an integer) as the calculated result, when the number of data transitions is greater than $$\frac{N}{2},$$

the controller 104 generates a control signal CTRL of a logic high level and provides it to the clock signal delay part 106. When the number of data transitions is less than $$\frac{N}{2},$$

the controller 104 generates a control signal CTRL of a low logic level and provides it to the clock signal delay part 106.

The clock signal delay part 106 receives the clock signal CLK from the semiconductor memory device and the control signal CTRL from the controller 104. The clock signal delay part 106 differentially delays the received clock signal CLK according to the logic level of the received control signal CTRL in order to generate a pair of corrected clock signals mCLK and mCLKb which are complementary to each other.

For example, when the control signal CTRL is at the high logic level, the clock signal delay part 106 generates a pair of corrected clock signals mCLK and mCLKb obtained by delaying the plurality of second parallel data mD0, mD1, ..., mD7 outputted from the register 102 by the first delay time TD1 (where TD1≧0). A pair of corrected clock signals mCLK and mCLKb are provided to the data selecting part 108. When the control signal CTRL is at the logic low level, the clock signal delay part 106 generates a pair of corrected clock signals mCLK and mCLKb obtained by delaying the plurality of second parallel data mD0, mD1, ..., mD7 outputted from the register 102 by a second delay time TD2 (where TD2≧TD1). A pair of corrected clock signals mCLK and mCLKb are provided to the data selecting part 108.

The data selecting part 108 receives the plurality of second parallel data mD0, mD1, ..., mD7 from the register 102 and the pair of corrected clock signals mCLK and mCLKb from the clock signal delay part 106. The data selecting part 108 selectively outputs and provides odd-numbered data omDi or even-numbered data emDi among the plurality of parallel data mD0, mD1, ..., mD7 to the output driving part 110 in synchronization with the pair of corrected clock signals mCLK and mCLKb.

The output driving part 110 receives and buffers data nD0, mD1, ..., mD7 outputted from the data selecting part 108. The output driving part 110 outputs buffered data y0, y1, ..., y7 as an output signal of the data output driver 100.

Referring to FIG. 2, the clock signal delay part 106, as stated previously, differentially delays the clock signal CLK according to a logic level of the control signal CTRL from the controller 104. The clock signal delay part 106 includes a first PMOS transistor MP0, a first NMOS transistor MN0, a second NMOS transistor MN1, a third NMOS transistor MN2, a first inverter INV1, and a second inverter INV2. The first PMOS transistor MP0 has a drain connected to a power source voltage terminal Vdd and is driven by the clock signal CLK. The first NMOS transistor MN0 is coupled between a source of the first PMOS transistor and a first node N1, and is driven by the control signal CTRL from the controller 104. The second NMOS transistor MN1 has a first electrode connected to the first node N1 and is driven by the control signal CTRL. The third NMOS transistor MN2 is coupled between a second electrode of the second NMOS transistor MN1 and a ground voltage terminal, and is driven by the clock signal CLK. The first inverter INV1 inverts the clock signal CLK and outputs a first corrected clock signal mCLK. The second inverter INV2 inverts an output signal of the first node N1 and outputs a second corrected clock signal mCLKb.

A description will now be given, with reference to FIG. 2, of an operation in the clock signal delay part 106. At first, when the control signal CTRL is at a logic high level, the first NMOS transistor MN0 and the second NMOS transistor MN1 are turned on. At this time, when the clock signal CLK is at a high logic level, an output of the first node N1 goes to a low logic level. Consequently, the first inverter INV1 outputs the first corrected clock signal mCLK of a low logic level and the second inverter INV2 outputs a second corrected clock signal mCLKb of a high logic level. Secondly, when the control signal CTRL is at a low logic level, the first NMOS transistor MN0 and the second NMOS transistor MN1 go to a high impedance status. At this time, if the clock signal CLK is at a high logic level, the output of the first node N1 is ignored. Consequently, the first inverter INV1 outputs the first corrected clock signal mCLK of a low logic level and the second inverter TNV2 outputs the second corrected clock signal mCLKb of a high logic level.

Accordingly, delay times of the first and second corrected clock signals mCLK and mCLKb with respect to the clock signal CLK when the control signal CTRL is at the high logic level are less than those when the control signal CTRL is at the low logic level. In a case where the clock signal CLK is at a low logic level, delay times of the first and second corrected clock signals mCLK and mCLKb with respect to the clock signal CLK when the control signal CTRL is at the low logic level are greater than those when the control signal CTRL is at the high logic level.

The data output driver 100 according to the present invention is used when a semiconductor memory device generates data at a falling edge as well as a rising edge like a double data rate DRAM or a Rambus DRAM. In order to do the just mentioned, the data selecting part 108 is formed by $$\frac{N}{2}$$

multiplexers which multiplex odd-numbered data and even-numbered data. For example, as shown in FIG. 1, when forming the register 102 by a pipeline outputting 8 parallel data, four 2-input multiplexers are used.

Referring to FIG. 3, a 2-input multiplexer 200 includes a first transfer gate 202, a second transfer gate 204, a third inverter INV3, and a fourth inverter INV4. The first transfer gate 202 transfers the odd numbered data omDi in response to the pair of corrected clock signals mCLK and mCLKb. The second transfer gate 204 transfers the even numbered data emDi in response to the pair of corrected clock signals mCLK and mCLKb. The third inverter INV3 delays an output of the first transfer gate 202. The fourth inverter INV4 delays an output of the second transfer gate 204. The third and fourth inverters INV3 and INV4 are connected to each other in series.

When the first corrected clock signal mCLK of a logic low level is applied to an inverting control terminal of the first transfer gate 202 and the second corrected clock signal mCLKb of a logic high level is applied to a non-inverting control terminal of the first transfer gate 202, the 2-input multiplexer 200 outputs odd numbered data omDi inputted through its input terminal to its output terminal. When the second corrected clock signal mCLKb of a logic low level is applied to the inverting control terminal of the second transfer gate 204 and the first corrected clock signal mCLK of a logic high level is applied to a non-inverting control terminal of the second transfer gate 204, the 2-input multiplexer 200 outputs even-numbered data emDi inputted through its input terminal to its output terminal. Consequently, at a rising edge of the first corrected clock signal mCLK, the even-numbered data emDi are delayed by the third and fourth inverters INV3 and TNV4 and the delayed even numbered data are outputted as a signal nDi. At a falling edge of the first corrected clock signal mCLK, the odd-numbered data omDi are delayed by the third and fourth inverters INV3 and INV4 and the delayed odd-numbered data are outputted as a signal nDi. As a result, the odd- and even-numbered data omDi and emDi are alternately outputted in synchronization with the pair of corrected clock signals mCLK and mCLKb.

Figure 4:
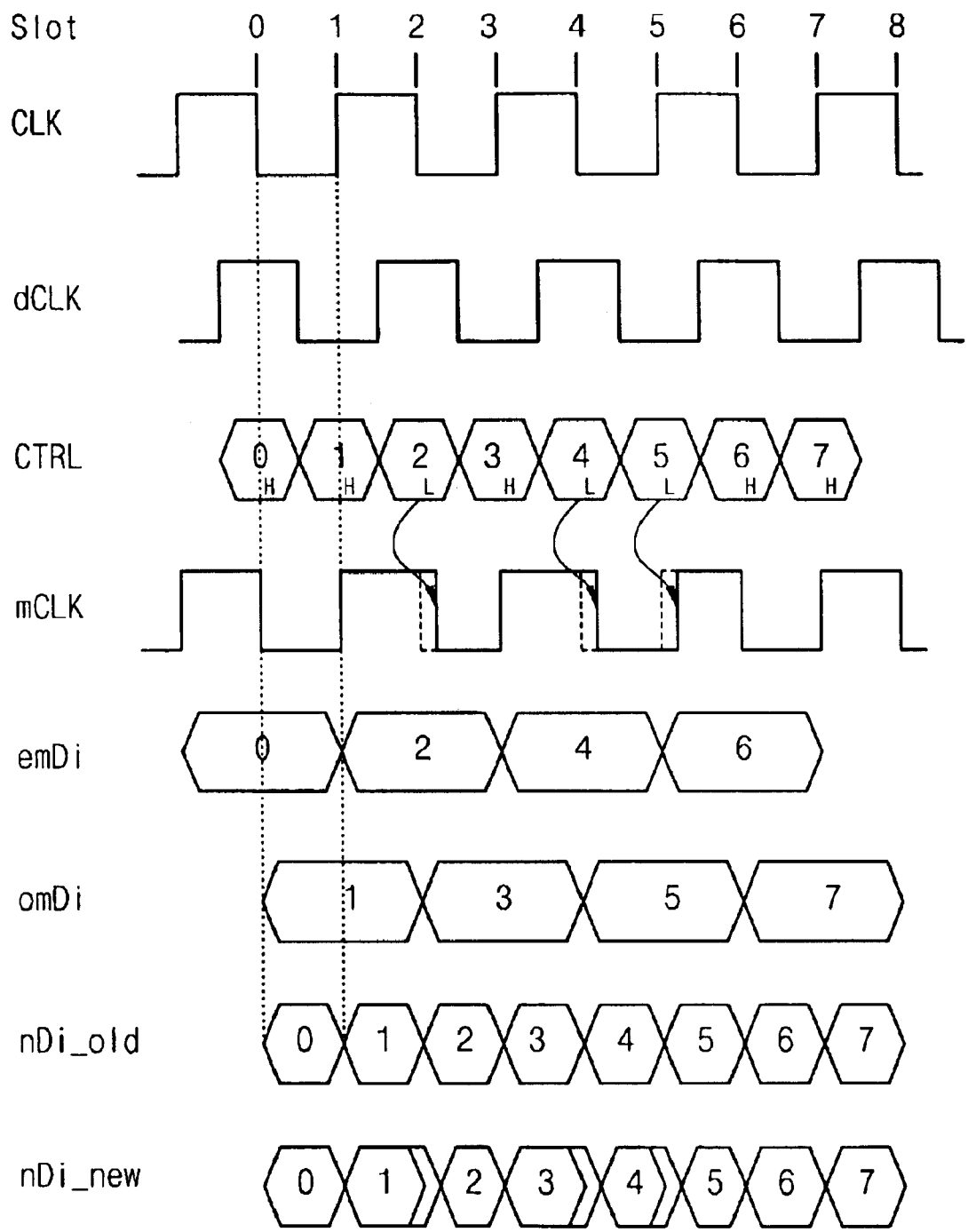
FIG. 4 is a timing chart illustrating an operation of the data output driver according to an embodiment of the present invention.

FIG. 4 is a timing chart illustrating the operation of the data output driver according to an embodiment of the present invention. Numeral reference CLK notes a main clock signal of a semiconductor memory device. Numeral reference dCLK represents a delayed clock signal obtained by delaying the clock signal CLK by a $$\frac{1}{4}$$

cycle of the clock signal CLK and is used as a synchronous signal. As shown in FIG. 4, at slots "0", "1", "3", "6", and "7", since the number of transitions to a high logic level exceeds four, the control signal CTRL is at a high logic level. At slots "2", "4", and "5", since the number of the transitions to a high logic level is equal to or less than four, the control signal CTRL is at a low logic level. The first corrected clock signal mCLK, the odd numbered data omDi, and the even numbered data emDi operate in the same method as illustrated previously with reference to FIG. 2. Data nDi_old provided to an output driving part in a conventional circuit has a predetermined period of time. However, corrected data nDi_new provided to an output driving part 110 according to the present invention has a differing period of time according to the level of the control signal CTRL from the controller 104. As a result, the corrected data nDi_new is provided the output driving part 110 to increase the minimal delay TDmin. It reduces the skew of the semiconductor memory device, thereby increasing an operation speed of the semiconductor memory device according to the present invention.

As mentioned above, the present invention differentially delays data to be outputted according to a transition pattern of the data in order to increase a minimal delay TDmin while maintaining a maximal delay TDmax as it is. As a result, it reduces the skew of the semiconductor memory device, thereby increasing an operation speed of the semiconductor memory device. According to the present invention, the degree of the improvement of skew changes according to the characteristics of a circuit. However, the degree of improvement of skew has a range from 100 psec to 188 psec.

Although a preferred embodiment of the present invention has been described for illustrative purposes, those skilled in the art will appreciate that various modifications, additions and substitutions are possible, without departing from the scope and spirit of the present invention as disclosed in the accompanying claims.

What is claimed is:

1. A data output driver of a semiconductor memory device, comprising:
   a register for receiving and storing a plurality of first parallel data in synchronization with a clock signal and for outputting a plurality of second parallel data;
   a controller for comparing a plurality of parallel data currently inputted to the register with a plurality of parallel data previously inputted to the register in response to a delayed clock signal obtained by delaying the clock signal for a predetermined time and calculating the number of data transitions based on the comparison result, and for generating a control signal according to the calculated number of data transitions;
   a clock signal delay part for delaying the clock signal according to a logic level of the control signal from the controller in order to generate a pair of corrected clock signals;
   a data selecting part for selectively outputting odd- or even-numbered data among the plurality of second parallel data; and
   an output driving part for buffering and outputting output data of the data selecting part.

2. The data output driver according to claim 1, wherein the register is formed by a plurality of pipelines which output the plurality of first parallel data in a first-in-first-out manner.

3. The data output driver according to claim 1, wherein the delayed clock signal is obtained by delaying the clock signal by a $$\frac{1}{4}$$

cycle of the clock signal.

4. The data output driver according to claim 1, wherein, in a case where the number of the plurality of first parallel data is N (where N is an integer), the controller generates a control signal of a first logic level when the number of data transitions is greater than $$\frac{N}{2},$$

and the controller generates a control signal of a second logic level when the number of data transitions is less than $$\frac{N}{2}.$$

5. The data output driver according to claim 4, wherein the number of data is the number of data which transit from the second logic level to the first logic level.

6. The data output driver according to claim 1, wherein the clock signal delay part generates a pair of corrected clock signals which are complementary to each other.

7. The data output driver according to claim 6, wherein the clock signal delay part generates the pair of corrected clock signals obtained by delaying the clock signal by a first delay time when the control signal is at the first logic level, and generates the pair of corrected clock signals obtained by delaying the clock signal by a second delay time when the control signal is at the second logic level.

8. The data output driver according to claim 1, wherein the clock signal delay part 106 includes a first PMOS transistor MP0 having a drain connected to a power source voltage terminal and being driven by the clock signal, a first NMOS transistor coupled between a source of the first PMOS transistor and a first node and being driven by the control signal from the controller, a second NMOS transistor having a first electrode connected to the first node and being driven by the control signal, a third NMOS transistor coupled between a second electrode of the second NMOS transistor and a ground voltage terminal and being driven by the clock signal, a first inverter for inverting the clock signal to output a first corrected clock signal, and a second inverter for inverting an output signal of the first node to output a second corrected clock signal.

9. The data output driver according to claim 1, wherein the data selecting part alternately outputs odd- and even-numbered data among the plurality of second parallel data in response to the pair of corrected clock signals from the clock signal delay part.

10. The data output driver according to claim 3, wherein the data selecting part includes $$\frac{N}{2}$$

(where, N is an integer) multiplexers when the number of the plurality of first parallel data is N.

11. The data output driver according to claim 10, wherein $$\frac{N}{2}$$

(where, N is an integer) multiplexers each includes a first transfer gate for transferring the odd-numbered data in response to the pair of corrected clock signals, a second transfer gate transferring the even-numbered data in response to the pair of corrected clock signals, and third and fourth inverters connected to each other in series for delaying outputs of the first and second transfer gates, respectively.

* * * * *